(12) United States Patent
Liu et al.

(10) Patent No.: US 7,379,301 B2
(45) Date of Patent: May 27, 2008

(54) INTEGRATED LIQUID COOLING SYSTEM

(75) Inventors: Tay-Jian Liu, Tu Cheng (TW);
Chao-Nien Tung, Tu Cheng (TW);
Chuen-Shu Hou, Tu Cheng (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 43 days.

(21) Appl. No.: 11/308,834

(22) Filed: May 12, 2006

(65) Prior Publication Data

US 2007/0103869 A1    May 10, 2007

(30) Foreign Application Priority Data

Nov. 8, 2005    (CN)    .......................... 200510101248

(51) Int. Cl.
*H05K 7/20*    (2006.01)
(52) U.S. Cl. ..................... 361/699; 361/695; 165/80.4; 165/104.31; 174/15.1; 415/90
(58) Field of Classification Search ................ 361/695, 361/699, 700; 165/104.19, 104.26, 104.21, 165/104.33, 104.31, 80.3, 182; 257/E23.098, 257/E23.099, E23.088, E23.086; 417/313; 415/90; 374/147; 310/32, 66 R, 67, 156
See application file for complete search history.

(56) References Cited

U.S. PATENT DOCUMENTS

| | | | | |
|---|---|---|---|---|
| 4,940,385 A | * | 7/1990 | Gurth | ......................... 415/206 |
| 6,019,165 A | * | 2/2000 | Batchelder | .................. 165/80.3 |
| 6,170,563 B1 | * | 1/2001 | Hsieh | .......................... 165/122 |
| 6,333,852 B1 | * | 12/2001 | Lin | ............................. 361/697 |
| 6,386,274 B1 | * | 5/2002 | Wang et al. | ................ 165/80.3 |
| 6,462,441 B1 | * | 10/2002 | Horng et al. | ............. 310/67 R |
| 6,652,223 B1 | * | 11/2003 | Horng et al. | .............. 415/53.1 |
| 6,913,072 B2 | * | 7/2005 | Luo | ...................... 165/104.21 |
| 6,981,543 B2 | * | 1/2006 | Chesser et al. | ......... 165/104.26 |
| 7,120,019 B2 | * | 10/2006 | Foster et al. | ................. 361/695 |
| 7,142,422 B2 | * | 11/2006 | Lee et al. | .................... 361/695 |
| 7,209,355 B2 | * | 4/2007 | Koga et al. | .................. 361/699 |
| 7,262,967 B2 | * | 8/2007 | Crocker et al. | ............. 361/699 |
| 7,269,013 B2 | * | 9/2007 | Chen et al. | .................. 361/700 |
| 7,274,566 B2 | * | 9/2007 | Campbell et al. | ........... 361/699 |
| 7,280,357 B2 | * | 10/2007 | Tomioka et al. | ............ 361/699 |
| 2004/0108104 A1 | * | 6/2004 | Luo | ........................... 165/181 |
| 2005/0168079 A1 | * | 8/2005 | Wos | ............................ 310/52 |
| 2007/0034359 A1 | * | 2/2007 | Liu et al. | ............... 165/104.31 |

* cited by examiner

*Primary Examiner*—Boris Chérvinsky
*Assistant Examiner*—Courtney L Smith
(74) *Attorney, Agent, or Firm*—Jeffrey T. Knapp

(57) ABSTRACT

An integrated liquid cooling system for removing heat from a heat-generating component includes a base (10), a pump (20) mounted in the base and a heat-dissipating member (30) communicating with the pump and coupling with the base. The pump includes a casing (21) having a chamber (212). A rotor (22), a partition seat (23) and a stator (24) are in turn received in the chamber. A top cover (25) is attached on the casing. The casing includes a bottom plate (214) having a bottom surface. The bottom surface of the bottom plate contacts the heat-generating electronic component for absorbing heat generated by the electronic component.

15 Claims, 16 Drawing Sheets

US 7,379,301 B2

INTEGRATED LIQUID COOLING SYSTEM

CROSS-REFERENCES TO RELATED APPLICATION

This application is related to U.S. patent application Ser. No. 11/308,547 filed on Apr. 5, 2006 and entitled "INTEGRATED LIQUID COOLING SYSTEM"; the co-pending U.S. patent application is assigned to the same assignee as the instant application. The disclosure of the above-identified application is incorporated herein by reference.

FIELD OF THE INVENTION

The present invention relates generally to a liquid cooling system for dissipation of heat from heat-generating components, and more particularly to an integrated liquid cooling system suitable for removing heat from electronic components of computers.

DESCRIPTION OF RELATED ART

With continuing development of the computer technology, electronic packages such as central process units (CPUs) are generating more and more heat that is required to be dissipated immediately. The conventional heat dissipating devices such as combined heat sinks and fans are not competent for dissipating so much heat any more. Liquid cooling systems have thus been increasingly used in computer technology to cool these electronic packages.

A typical liquid cooling system generally comprises a heat-absorbing member, a heat-dissipating member and a pump. These individual components are connected together in series so as to form a heat transfer loop. In practice, the heat-absorbing member is maintained in thermal contact with a heat-generating component (e.g., a CPU) for absorbing heat generated by the CPU. The liquid cooling system employs a coolant circulating through the heat transfer loop so as to continuously bring the thermal energy absorbed by the heat-absorbing member to the heat-dissipating member where the heat is dissipated. The pump is used to drive the coolant, after being cooled in the heat-dissipating member, back to the heat-absorbing member.

In the typical liquid cooling system, the heat-absorbing member, the heat-dissipating member and the pump are connected together generally by a plurality of connecting tubes so as to form the heat transfer loop. However, the typical liquid cooling system has a big volume and occupies more room in a computer system, and is not adapted to a small room of a personal computer (PC). Furthermore, the liquid cooling system has many connecting tubes with a plurality of connections, which is prone to lead to a leakage of the coolant so that the system has a low reliability and a high cost. Moreover, the heat-absorbing member, the heat-dissipating member and the pump are to be located at different locations when mounted to the computer system. In this situation, mounting of the liquid cooling system to the computer system or demounting of the liquid cooling system from the computer system is a burdensome and time-consuming work.

Therefore, it is desirable to provide a liquid cooling system which overcomes the foregoing disadvantages.

SUMMARY OF THE INVENTION

An integrated liquid cooling system in accordance with an embodiment of the present invention for removing heat from a heat-generating electronic component includes a base, a pump mounted in the base and a heat-dissipating member communicating with the pump and coupling with the base. The pump includes a casing having a chamber. A rotor, a partition seat and a stator are in turn received in the chamber. A top cover is attached on the casing. The casing comprises a bottom plate having a bottom surface. The bottom surface of the bottom plate contacts the heat-generating electronic component for absorbing heat generated by the electronic component. The base, the pump and the heat-dissipating member are connected together in series to thereby form a heat transfer loop, without the necessity of using any connecting tube. Thus, these individual components of the liquid cooling system are assembled together without any connecting tubes. The integrated liquid cooling system is compact in structure and has a low cost, high reliability and increased heat-dissipating effect.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
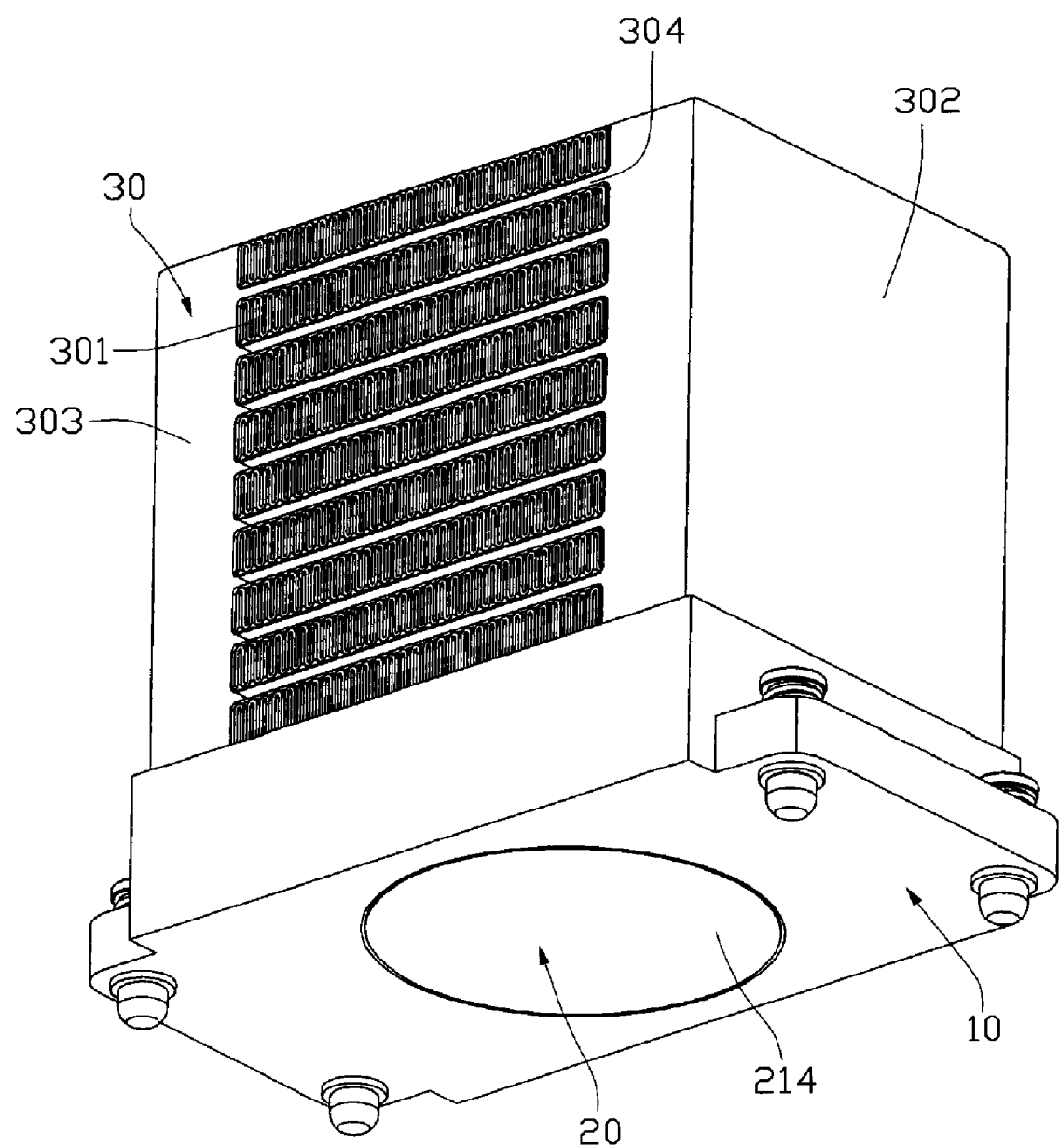
FIG. 1 is an assembled, isometric view of a liquid cooling system in accordance with a preferred embodiment of the present invention.
Figure 2:
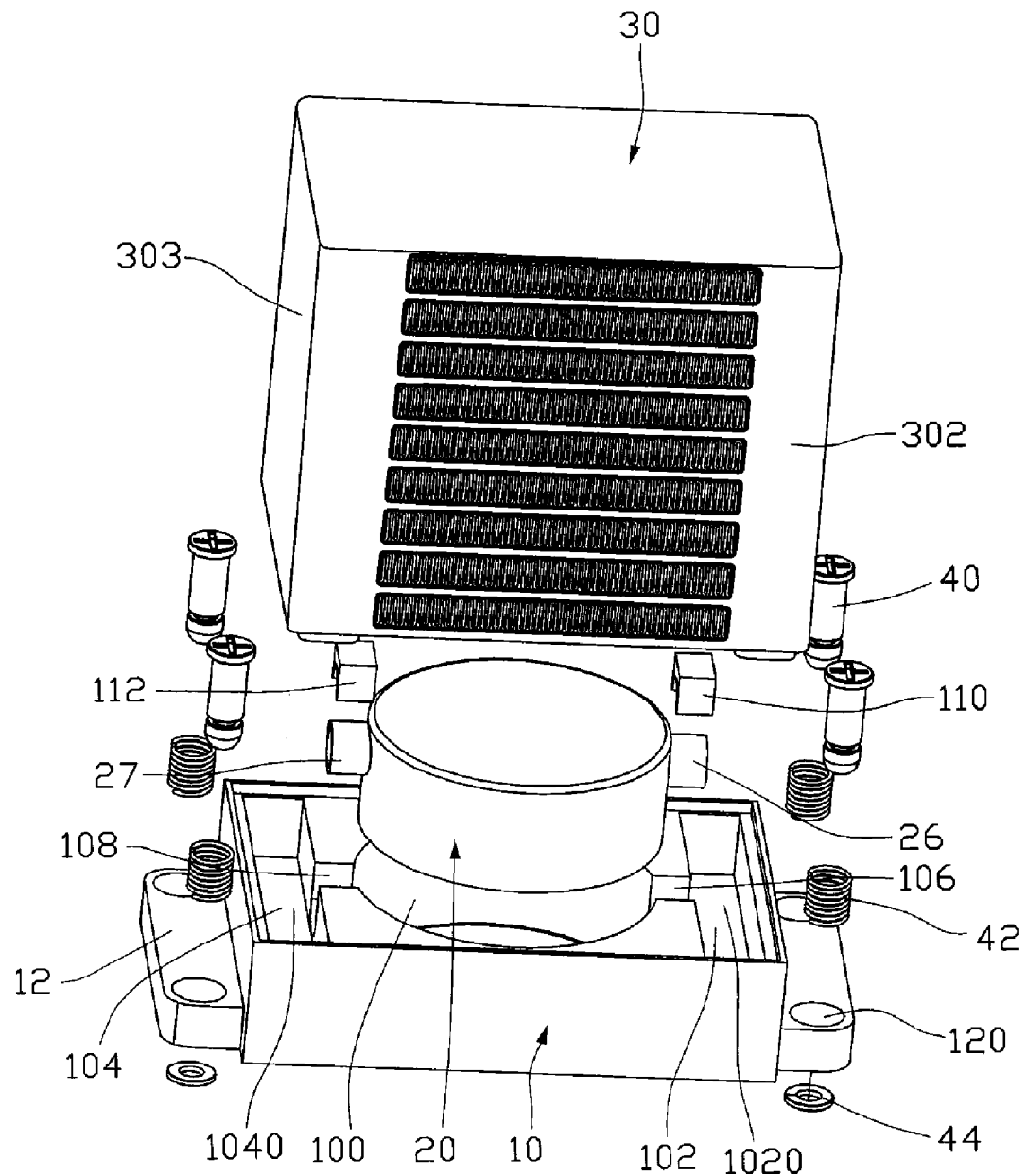
FIG. 2 is an exploded view of FIG. 1, but shown from another aspect.

FIG. 1 and FIG. 2 illustrate a liquid cooling system in accordance with a preferred embodiment of the present invention. The liquid cooling system includes a base 10, a pump 20 mounted in the base 10, and a heat-dissipating member 30 communicating with the pump 20 and coupling with the base 10. The base 10, the pump 20 and the heat-dissipating member 30 are connected together in series without any connecting tubes. A heat transfer loop is formed by the base 10, the pump 20 and the heat dissipating member 30. A coolant such as water is filled into the pump 20 and is circulated through the heat transfer loop under a drive of the pump 20.

The base 10 is made from Polyethylene (PE) or Acrylonitrile Butadiene Styrene (ABS), and has a rectangular configuration. The base 10 defines an opening 100 in a central portion thereof for receiving and securing the pump 20 therein. The base 10 forms a pair of ears 12 extending from left and right sides thereof, wherein a pair of mounting holes 120 is defined in each ear 12 for receiving screws 40 with springs 42 therein. Annular rings 44 are used to snap in recesses (not labeled) defined in lower portions of the screws 40 thereby to attach the screws 40 and the springs 42 to the base 10 before the liquid cooling system is mounted on a supporting member (not shown), for example, a printed circuit board on which a heat-generating electronic component is mounted. A pair of rectangular slots 102, 104 is symmetrically defined at two opposite sides of the base 10 beside the opening 100. A pair of rectangular channels 106,108 is respectively defined between the opening 100 and the slots 102, 104. The channels 106, 108 communicate the opening 100 with the slots 102, 104.

Figure 4:
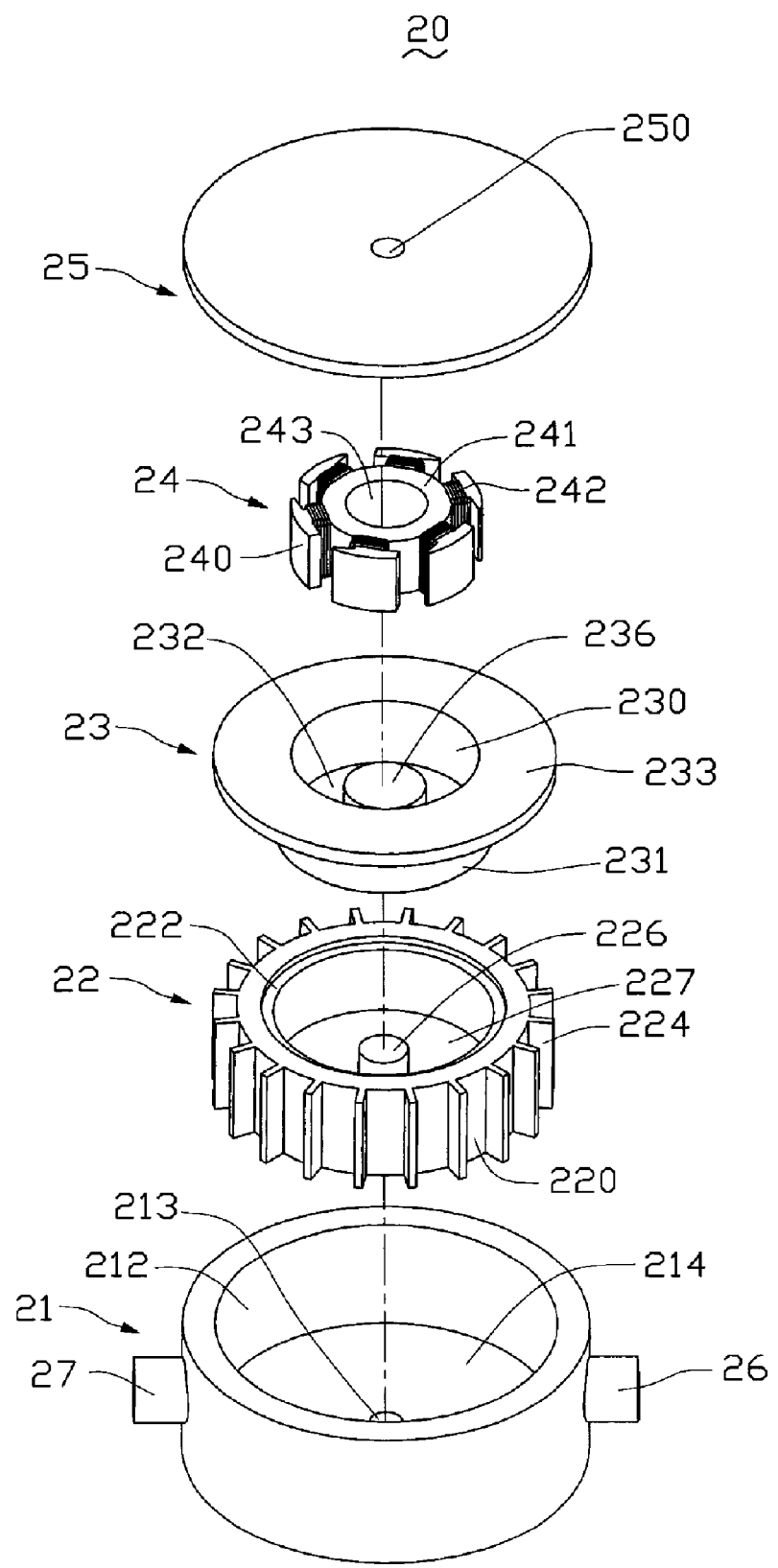
FIG. 4 is an exploded view of a pump of the liquid cooling system of FIG. 2.
Figure 5:
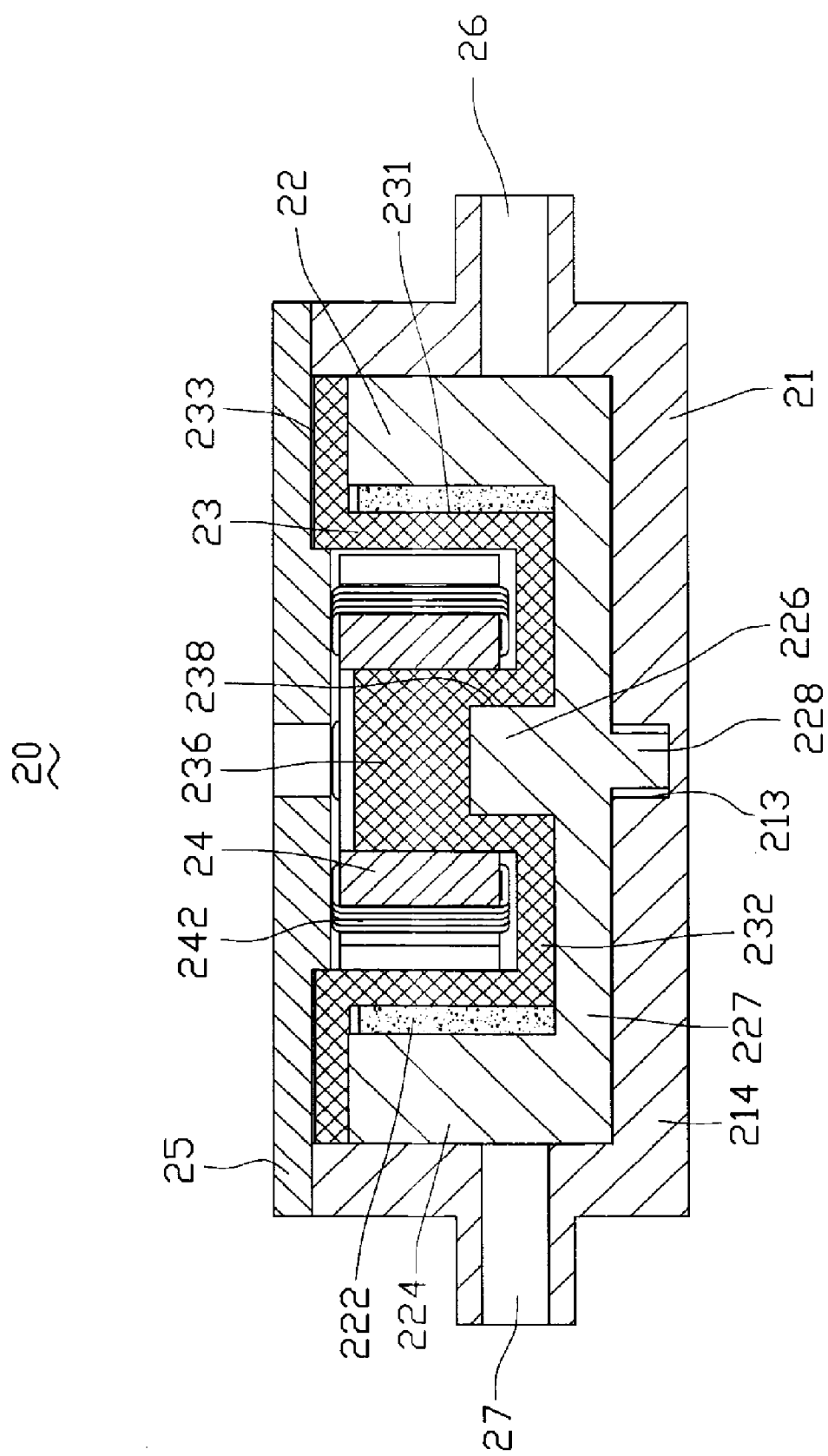
FIG. 5 is a cross-sectional view of the pump of FIG. 2.

With reference also to FIGS. 4-5, the pump 20 comprises a hollow casing 21, a magnetic rotor 22, a partition seat 23, a stator 24 and a top cover 25 hermetically attached to a top end of the casing 21.

The casing 21 is made of metal material with good heat conductivity, and defines a chamber 212 for in series receiving the rotor 22, the partition seat 23 and the stator 24 therein. The casing 21 comprises a bottom plate 214 having a blind hole 213 defined in a central portion thereof. The bottom plate 214 serves as a heat-absorbing plate to contact with the heat-generating electronic component and absorb heat generated by the electronic component. An inlet 26 corresponding to the channel 106 of the base 10 and an outlet 27 corresponding to the channel 108 of the base 10 are formed at two opposite sides of an outer surface of the casing 21, so that the coolant is capable of entering into casing 21 via the inlet 26 and escaping the casing 21 via the outlet 27.

The magnetic rotor 22 has a hollow cylindrical configuration and is mounted in the chamber 212 of the casing 21. The rotor 22 includes an impeller having a wall 220 and a substrate 227 connecting with a bottom end of the wall 220, and a magnetic ring 222 securely abutting against an inner surface of the wall 220 of the impeller. The substrate 227 contacts with the bottom plate 214 of the casing 21 to insure a stable rotation of the rotor 22 relative to the casing 21. An upper axle 226 extends upwardly from a center of the substrate 227 of the impeller. A lower axle 228 extends downwardly from the center of the substrate 227 of the impeller, for engaging in the blind hole 213 of the bottom plate 214 of the casing 21. The impeller forms a plurality of plate-shaped vanes 224 extending radially and outwardly from an outer surface of the wall 220. When the rotor 22 rotates, the plate-shaped vanes 224 agitate the coolant in the chamber 212 of the casing 21, for providing a pressure to the coolant and to thereby circulate the coolant in the liquid cooling system.

The partition seat 23 is mounted between the rotor 22 and the stator 24 for isolating the coolant from the stator 24 to prevent the coolant from entering the stator 24 and short-circuiting of the stator 24. The partition seat 23 comprises a cylindrical body 231 having an inner space 230, and an annular plate 233 extending outwardly from a top of the cylindrical body 231. A shaft 236 extends upwardly from a center of a bottom portion 232 of the cylindrical body 231. A mating hole 238 is defined in a center of a bottom portion 232, for receiving the upper axle 226 of the rotor 22 therein. The bottom portion 232 contacts with the substrate 227 of the motor 22.

The stator 24 is received in the space 230 of the partition seat 23. The stator 24 comprises a cylindrical center portion 241 having a center hole 243 defined therein, six generally T-shaped pole members 240 extending radially and outwardly from the center portion 241. The center hole 243 of the center portion 241 fittingly receives the shaft 236 of the partition seat 23. Each pole member 240 of the stator 24 is wound by a coil 242. A printed circuit board (not shown) is mounted on a top of the center portion 241 and electrically connects with the coils of the stator 24.

The top cover 25 defines a center hole 250 therein, for providing passage of lead wires of the printed circuit board therethough. An edge of the top cover 25 hermetically contacts with the top of the casing 21.

Figure 3:
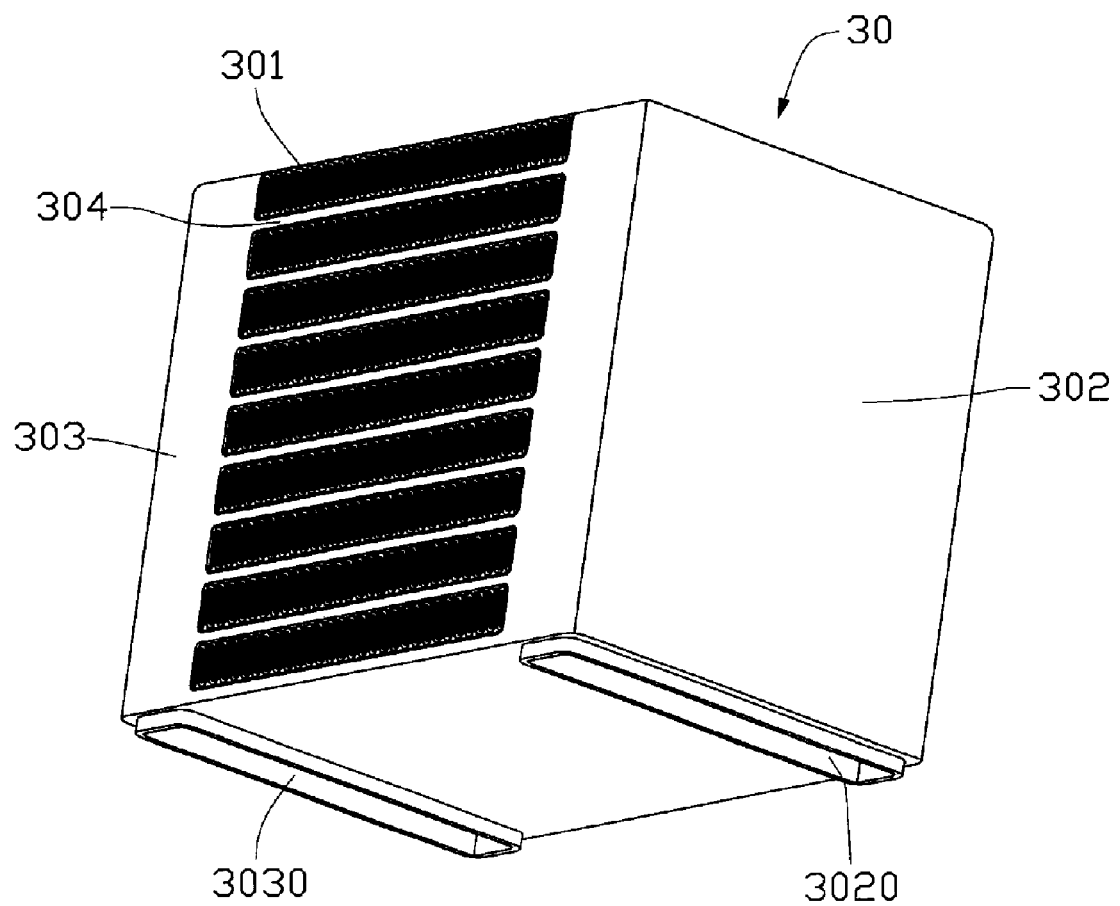
FIG. 3 is an isometric view of a heat-dissipating member of the liquid cooling system of FIG. 2.

Referring to FIG. 2 and FIG. 3, the heat-dissipating member 30 includes a plurality of metal fins 301, a plurality of heat-dissipating conduits 304, and a pair of opposite fluid tanks 302, 303 connected to ends of the heat-dissipating conduits 304. The fluid tanks 302, 303 have openings 3020, 3030 corresponding to openings 1020, 1040 of the slots 102, 104 of the base 10.

In assembly, the pump 20 is mounted in the center opening 100 of the base 10, wherein the inlet 26 and the outlet 27 are respectively received in the channels 106, 108, and a pair of blocks 110, 112 surrounding around the inlet 26 and the outlet 27 is clamped in the channels 106, 108, for fixing the inlet 26 and the outlet 27 to the channels 106, 108. The inlet 26 and the outlet 27 communicate with the slots 102, 104, respectively. The heat-dissipating member 30 is mounted on the base 10, wherein the openings 3020, 3030 of the fluid tanks 302, 303 are communicated with the openings 1020, 1040 of the slots 102, 104, respectively, so that the fluid tanks 302, 303 of the heat-dissipating member 30 are in fluid communication with the slots 102, 104 of the base 10. Thus, the base 10, the pump 20 and the heat-dissipating member 30 are connected together without any connecting tubes, and the pump 20 is in fluid communication with both of the base 10 and the heat-dissipating member 30 so as to drive the coolant to circulate through the chamber 212 of the pump 20, the slots 102, 104 of the base 10 and the fluid tanks 302, 303 and the conduits 304 of the heat-dissipating member 30. The combination of the base 10, the pump 20 and the heat-dissipating member 30 is fixed to the printed circuit board such that the bottom plate 214 of the pump 20 intimately contacts with the electronic component on the printed circuit board.

In operation, the coils 242 of the stator 24 are powered firstly to drive the magnetic ring 222 to rotate. The impeller is driven to rotate with the magnetic ring 222. The impeller thus rotates, and thereby the plate-shaped vanes 224 drive the coolant to circulate in the liquid cooling system. Simultaneously, heat generated by the electronic component is absorbed by the bottom plate 214 of the pump 20 and then is transferred to the coolant contained in the chamber 212 of the casing 21 of the pump 20. The rotatable impeller quickly agitates the coolant via the plate-shaped vanes 224 thereof and increases the pressure of the coolant to circulate the coolant in the liquid cooling system. The coolant absorbing the heat has a higher temperature and is driven out of the casing 21 of the pump 20 via the outlet 27, and flows to the heat-dissipating member 30 via the slot 104 of the base 10 and the fluid tank 303 of the heat-dissipating member 30. Thereafter, the coolant flows to the fluid tank 302 through the conduits 304 where the heat is dissipated to ambient environment via the fins 301. After releasing the heat, the coolant having a lower temperature is brought back to the chamber 212 of the pump 20 via the inlet 26, thus continuously taking the heat away from the electronic component.

Figure 6:
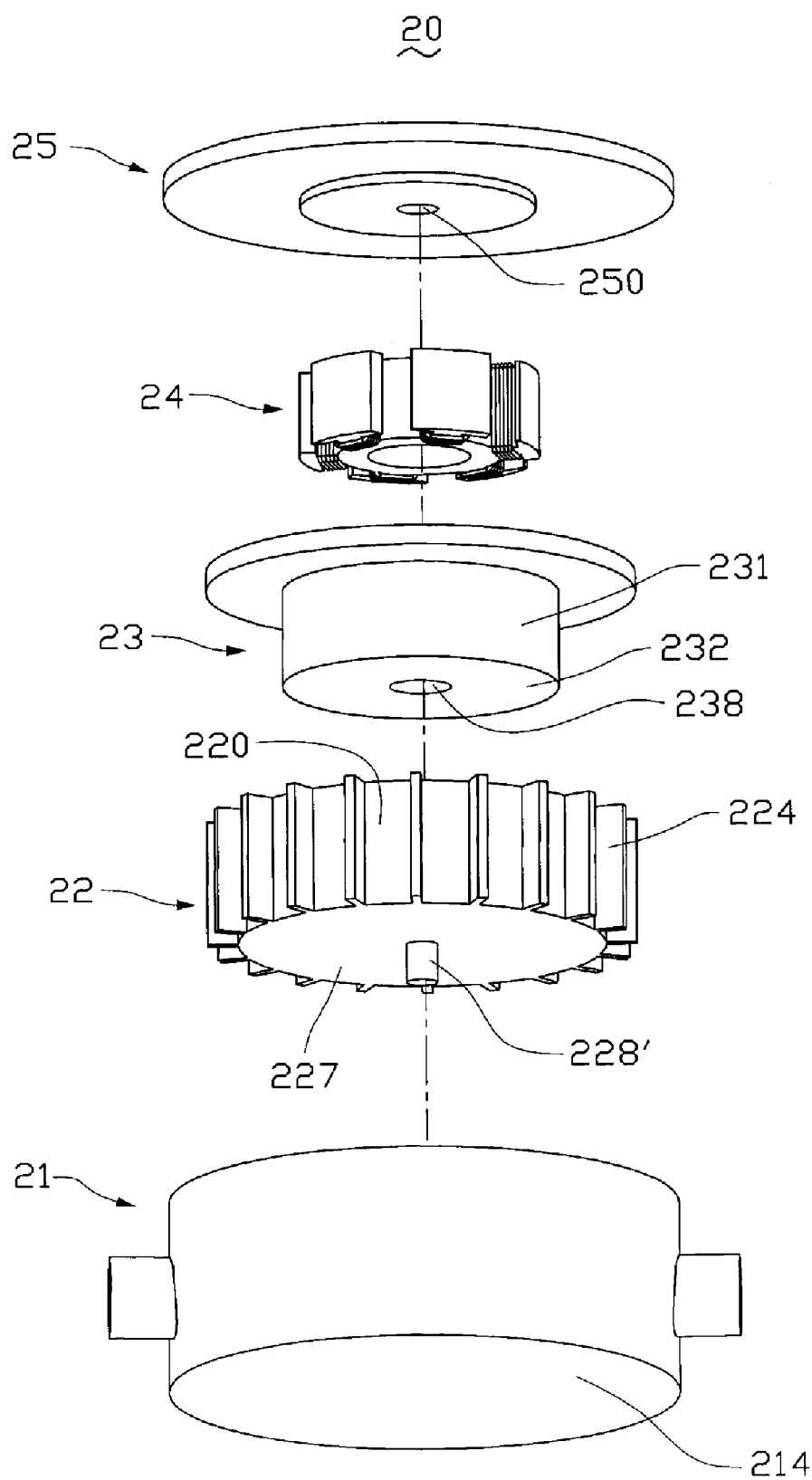
FIG. 6 is an exploded view of a pump of a liquid cooling system in accordance with a second embodiment of the present invention.
Figure 7:
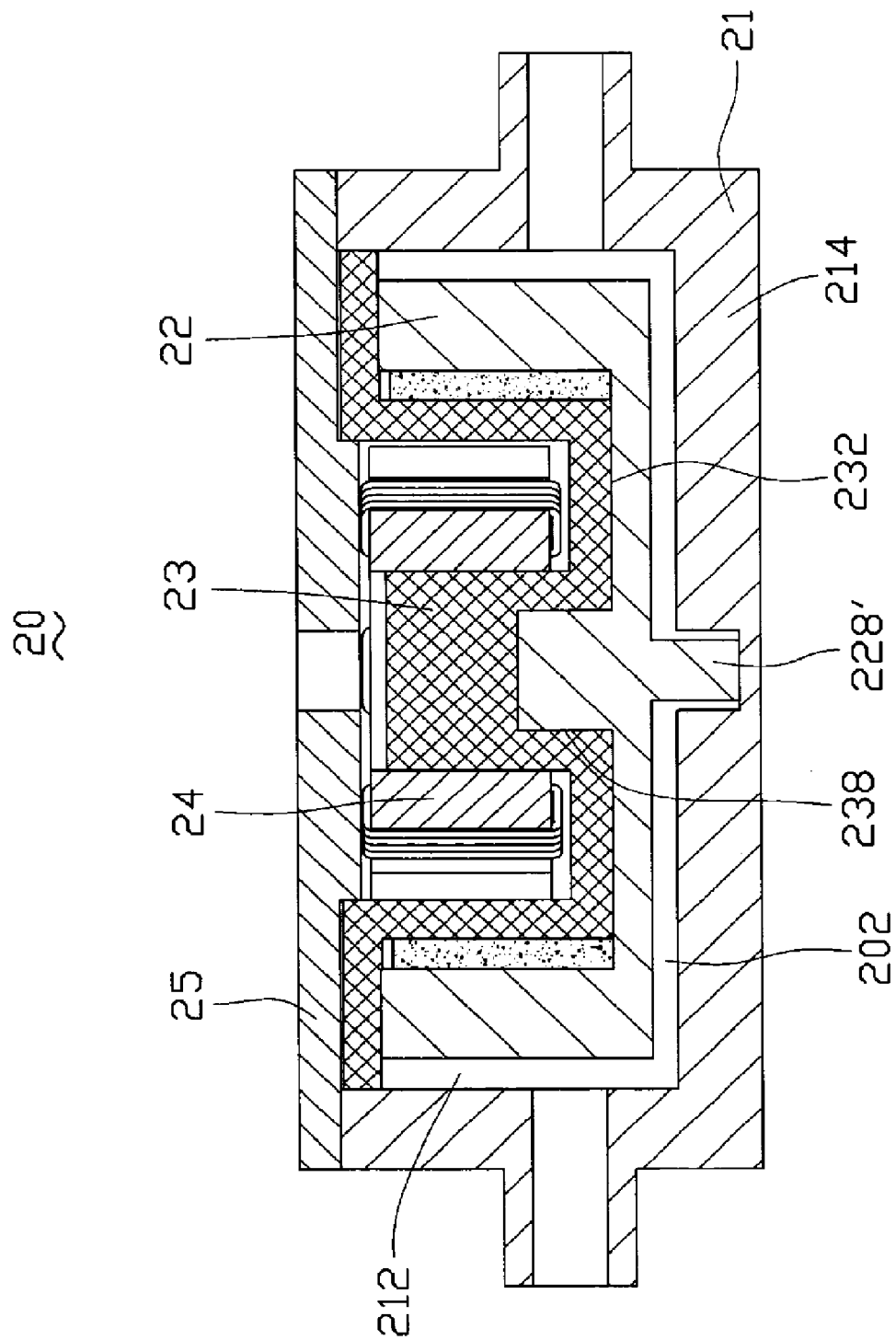
FIG. 7 is an assembled, cross-sectional view of the pump of FIG. 6.

FIGS. 6-7 show a pump 20 in accordance with a second embodiment of the present invention. The pump 20 of the second embodiment is similar to the previous preferred embodiment. However, a lower axle 228' of the rotor 22 replaces the lower axle 228 of the rotor 22 of the previous preferred embodiment. The lower axle 228' has a longer length than that of the lower axle 228 such that a gap 202 is defined between the substrate 227 of the impeller of the rotor 22 and the bottom plate 214 of the casing 21. In use, the coolant flows through the gap 202, which is located adjacent to the central portion of the bottom plate 214 of the casing 21 of the pump 20, whereby the heat absorbed by the bottom plate 214 from the electronic component can be more directly transferred to the coolant and effectively taken away by the coolant.

Figure 8:
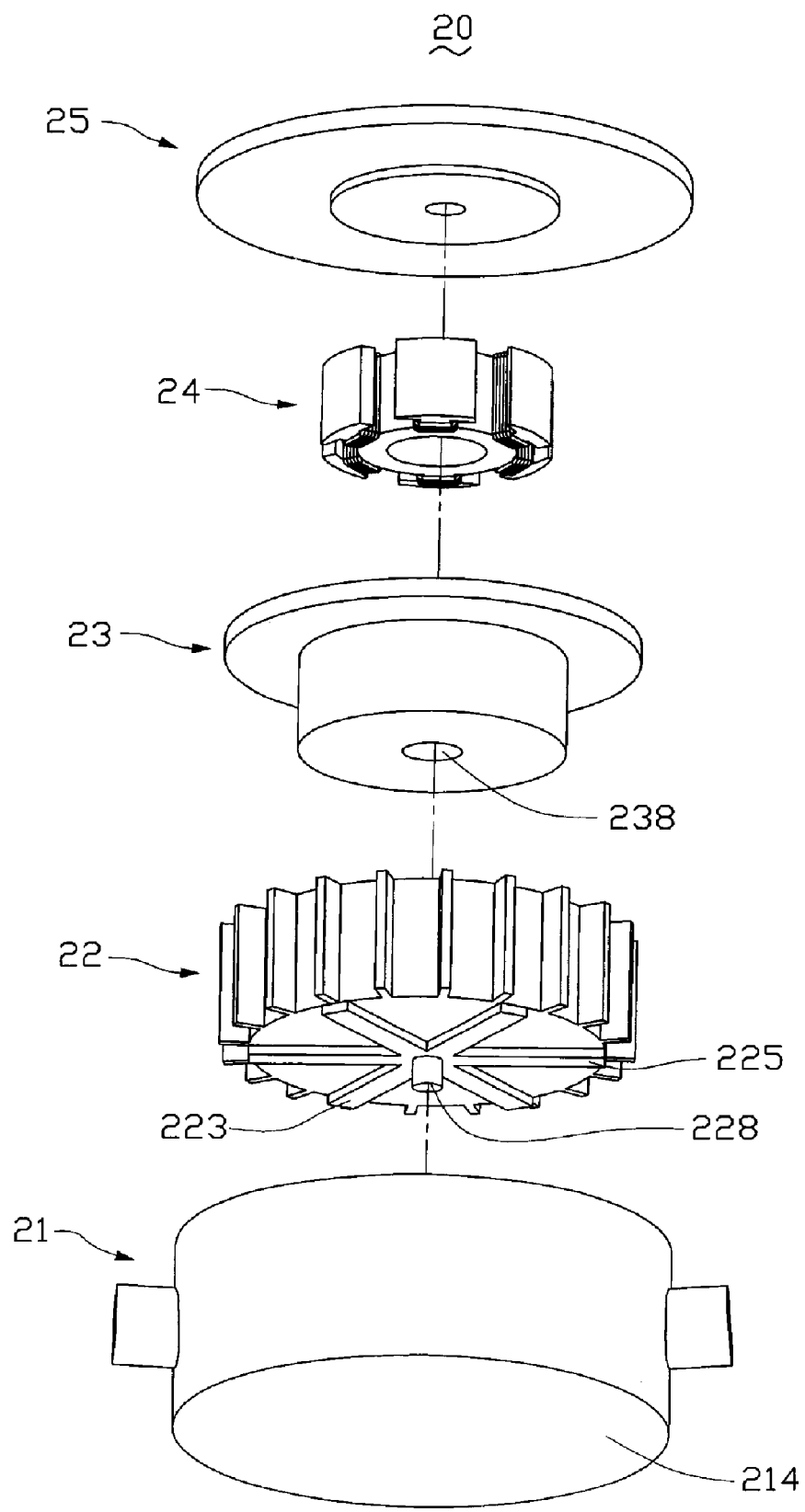
FIG. 8 is an exploded view of a pump of a liquid cooling system in accordance with a third embodiment of the present invention.
Figure 9:
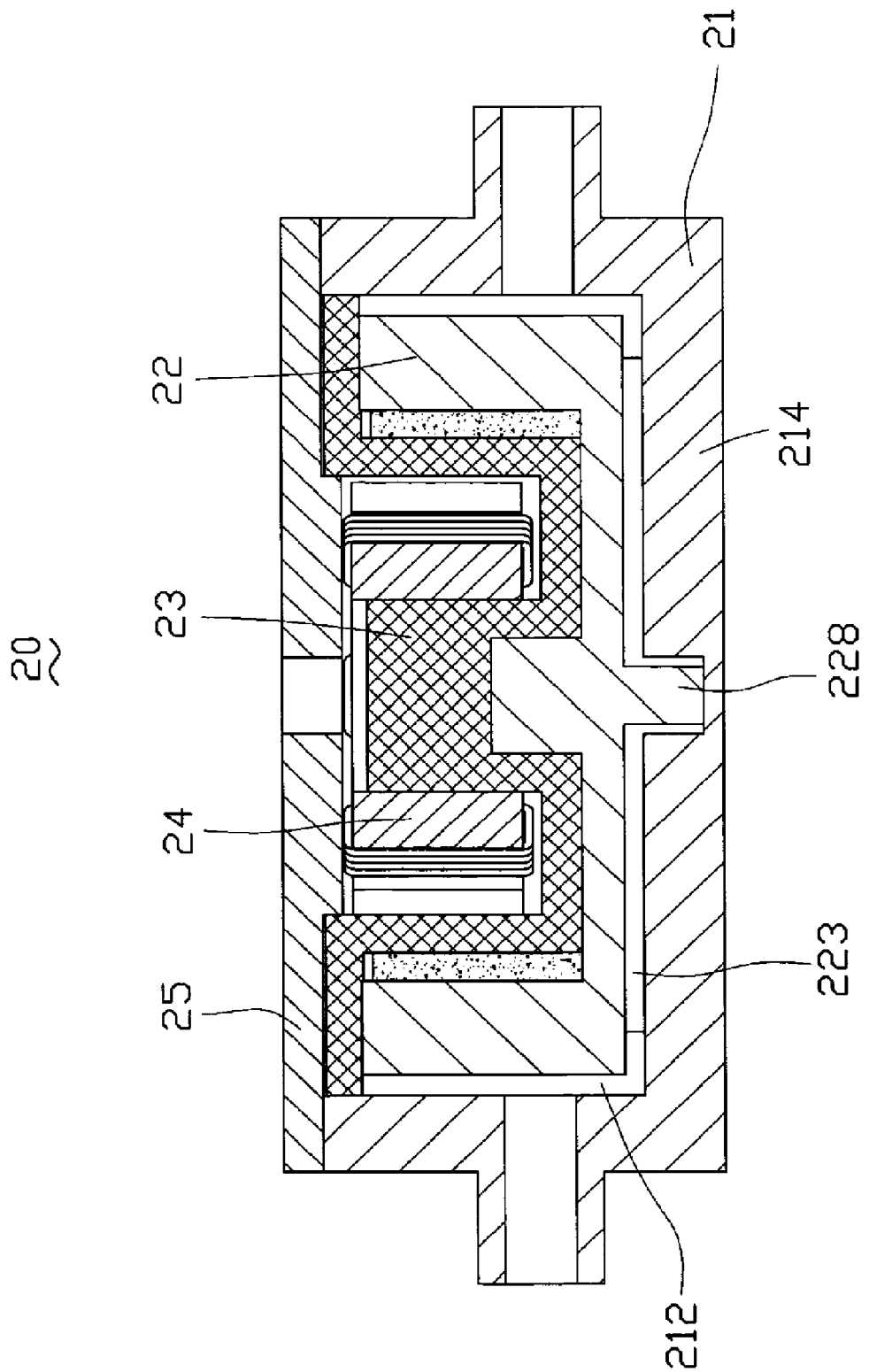
FIG. 9 is an assembled, cross-sectional view of the pump of FIG. 8.
Figure 10:
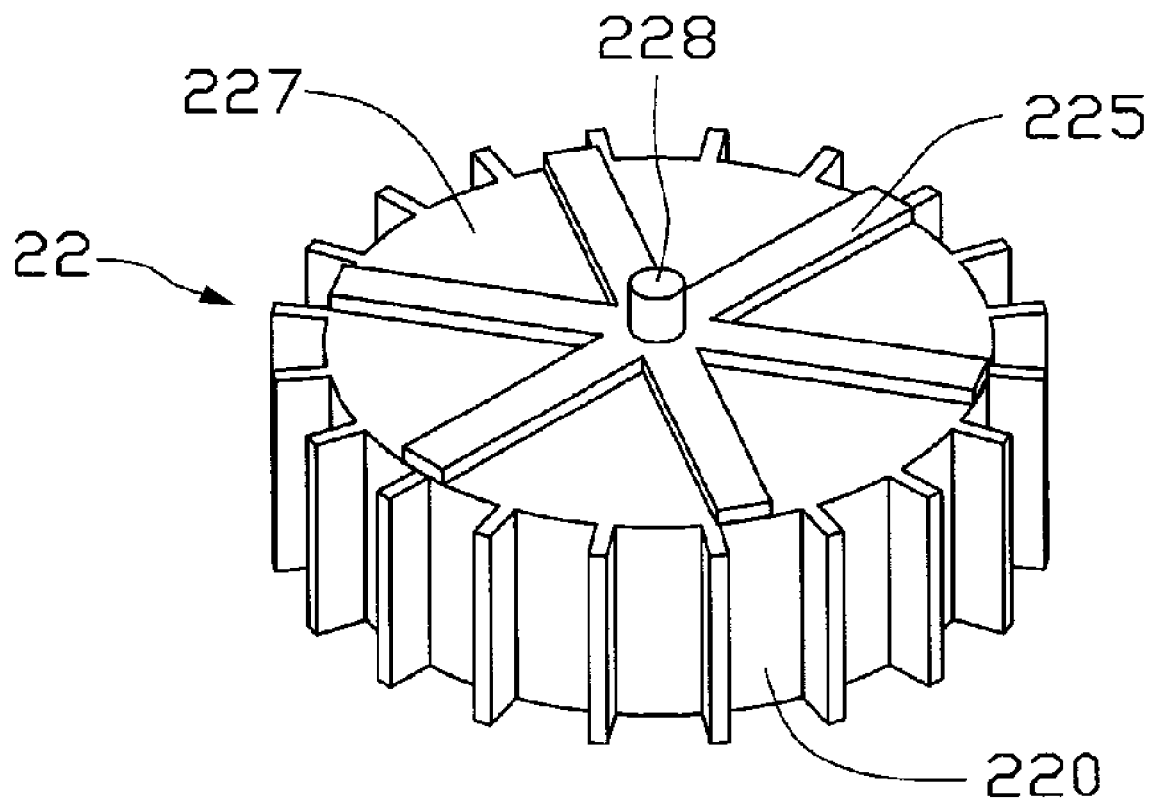
FIG. 10 is an isometric view of a rotor of the liquid cooling system of FIG. 8.
Figure 11:
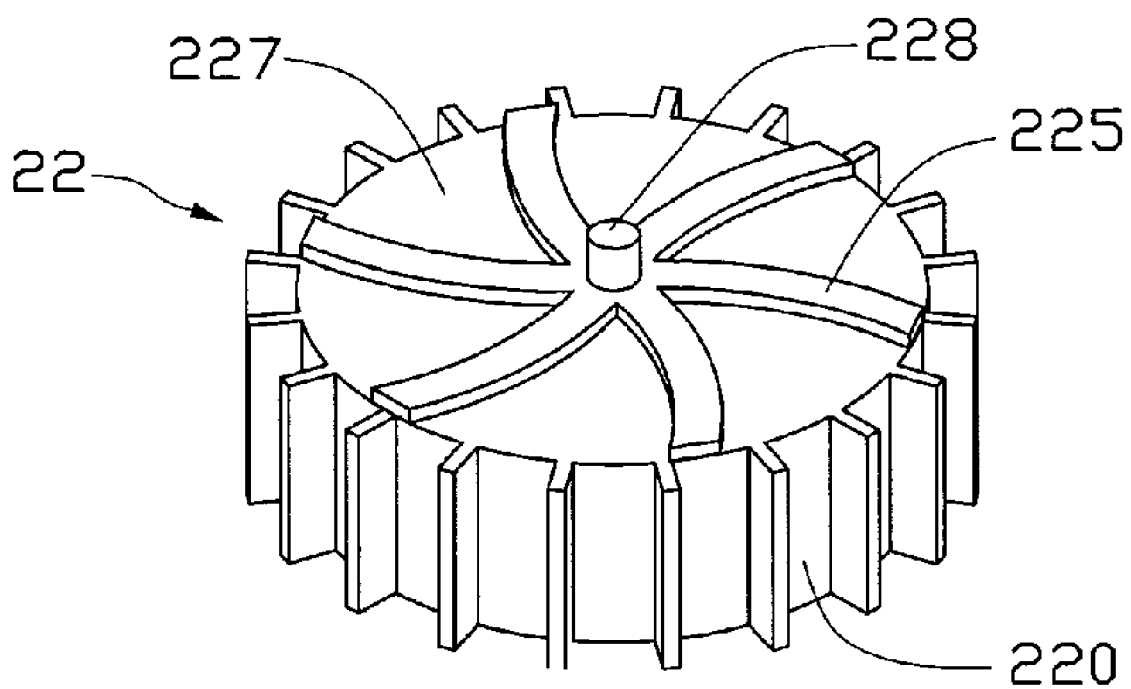
FIG. 11 is an isometric view of a rotor in accordance with an alternative embodiment.
Figure 12:
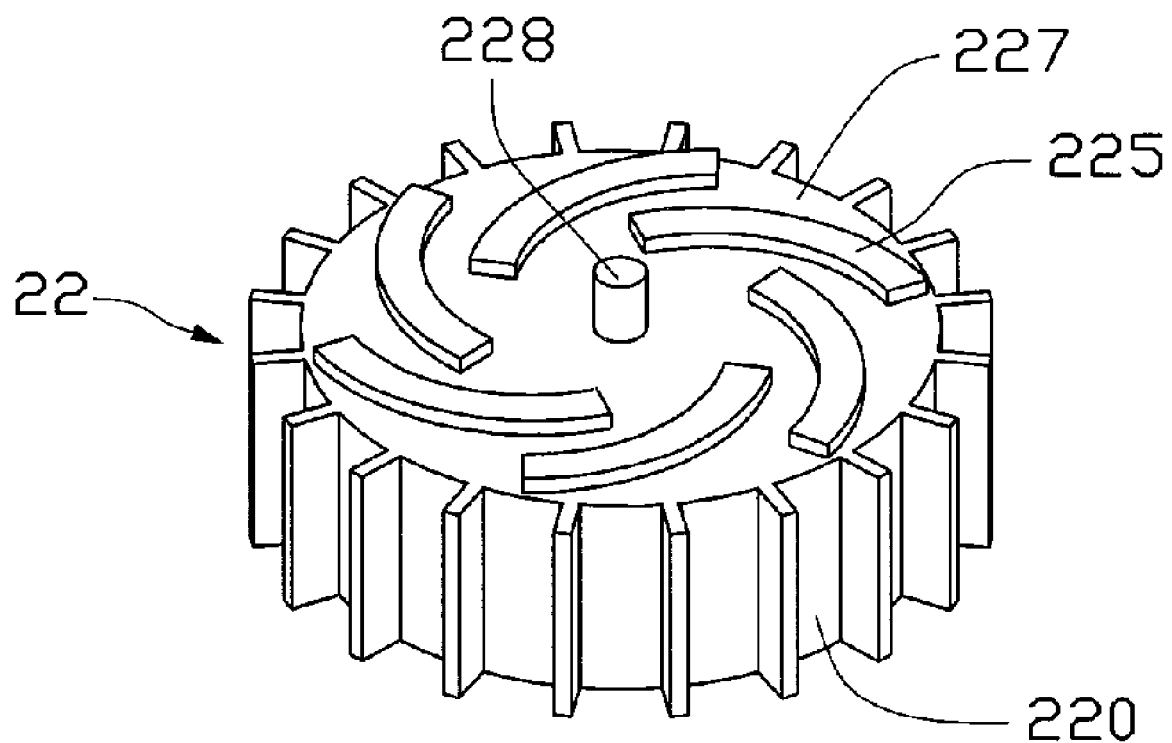
FIG. 12 is an isometric view of a rotor in accordance with another embodiment.

FIGS. 8-10 show a pump in accordance with a third embodiment of the present invention. The pump of the third embodiment is similar with that of the second embodiment. However, in the third embodiment, an agitator 223 is received in the chamber 212 of the casing 21, for agitating the coolant of the chamber 212. The agitator 223 is formed on a bottom surface of the substrate 227 of the rotor 22. The agitator 223 comprises a plurality of agitating plates 225 extending radially and outwardly from the lower axle 228. A shape of the agitating plate 225 is linear (shown in FIGS. 8 and 10). Please refer to FIGS. 11-12, alternatively, the agitating plates 225 may have a curvilinear configuration, wherein the agitating plates 225 of FIG. 12 each are arc-shaped and around the lower axle 228 without connection with the lower axle 228.

Figure 13:
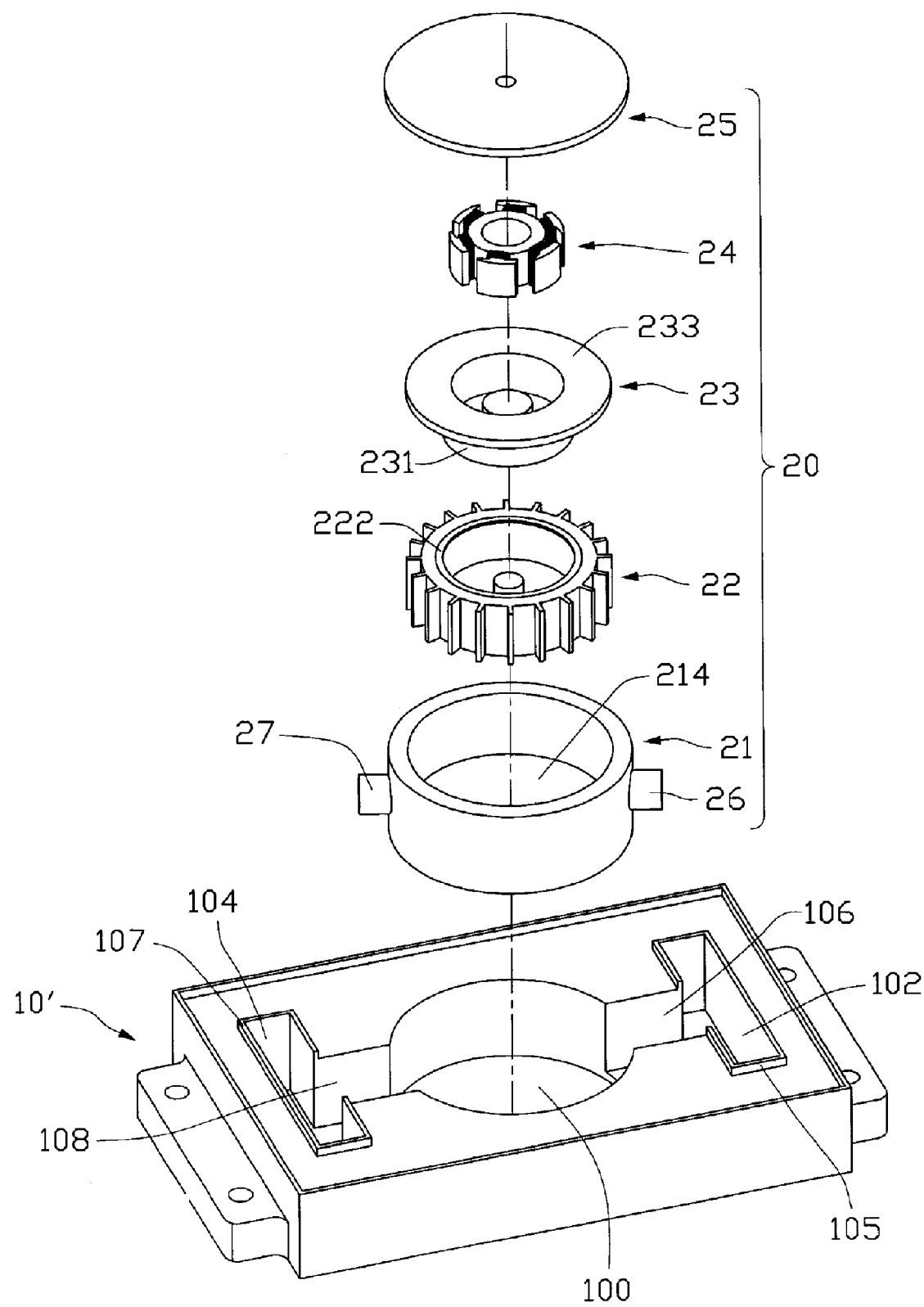
FIG. 13 is an exploded view of a pump and a base of a liquid cooling system in accordance with a fourth embodiment of the present invention.
Figure 14:
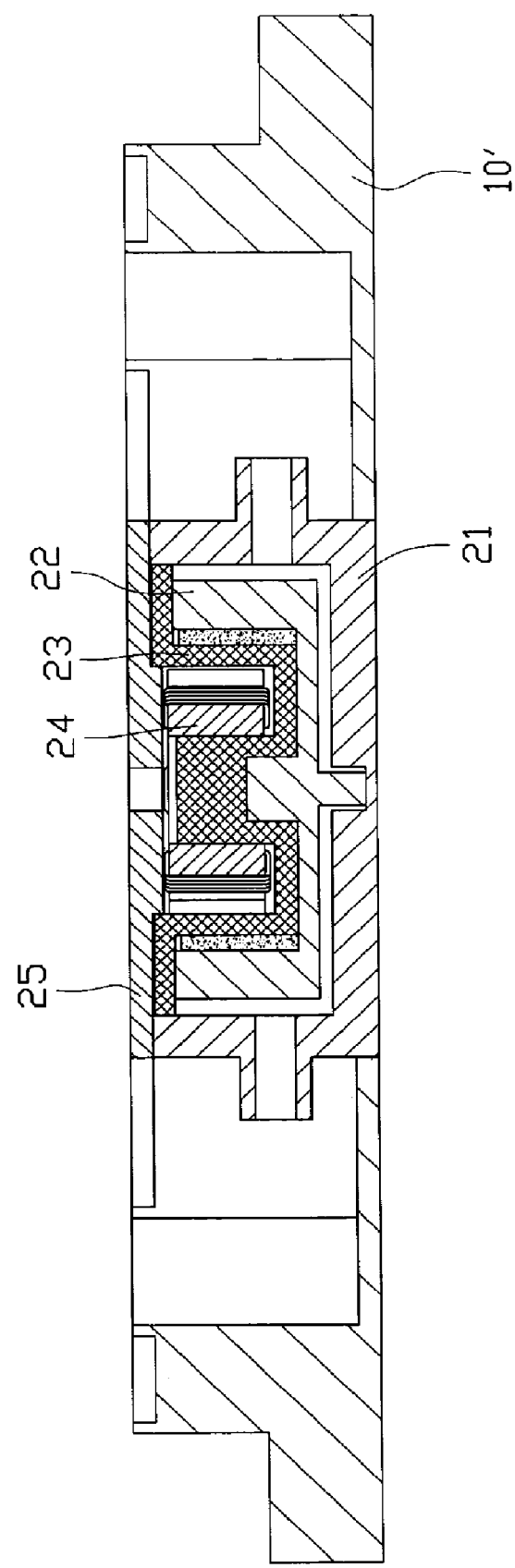
FIG. 14 is an assembled, cross-sectional view of the pump and the base of FIG. 13.

FIGS. 13-14 show a pump 20 and a base 10' in accordance with a fourth embodiment of the present invention. In the fourth embodiment, the base 10' replaces the base 10 of the aforementioned embodiments. The base 10' forms joint flanges 105, 107 at a top of the slots 102, 104 thereof, for hermetically engaging in the openings 3020, 3030 of the fluid tanks 302, 303 of the heat-dissipating member 30.

Figure 15:
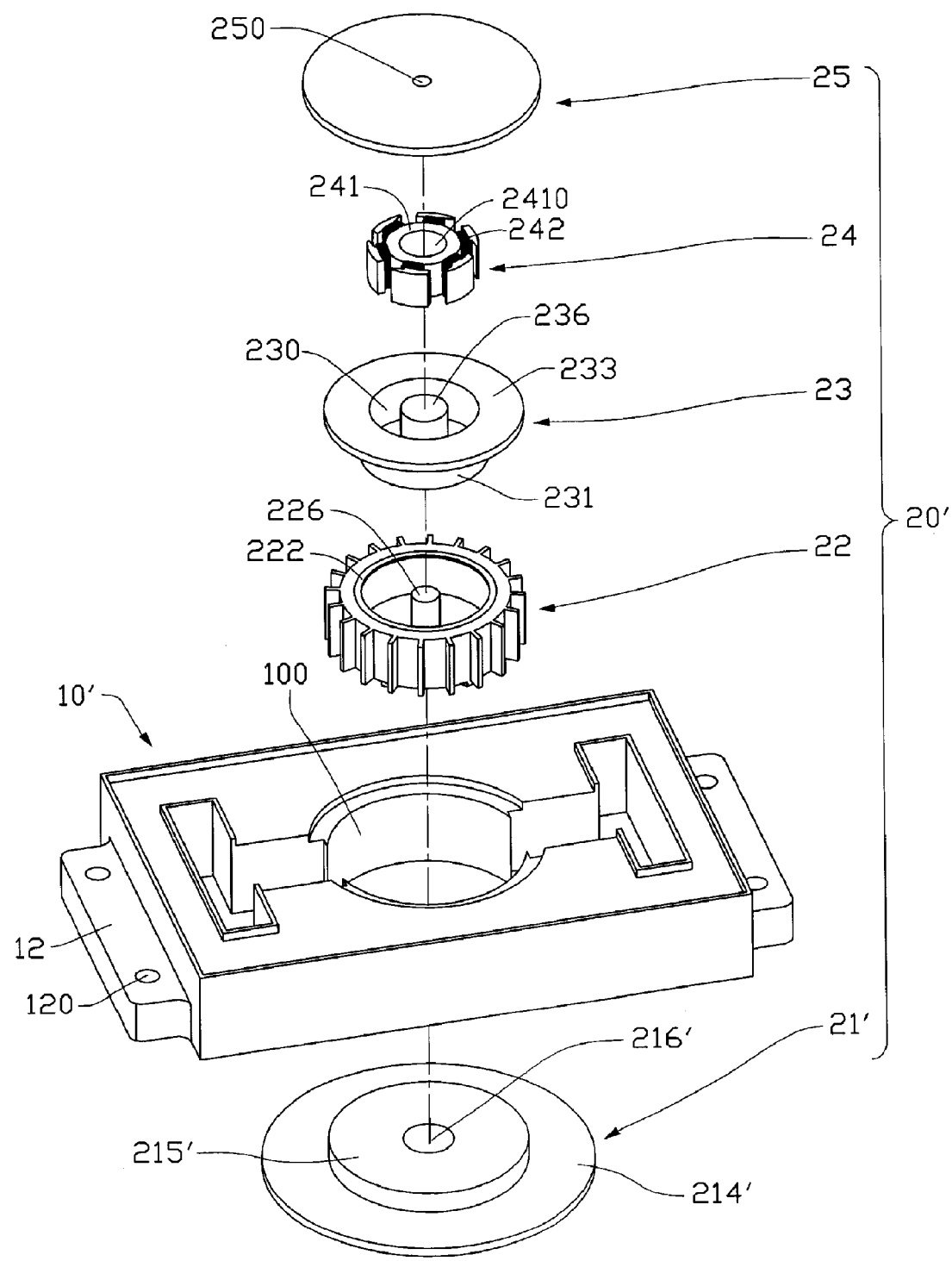
FIG. 15 is an exploded view of a pump and a base of a liquid cooling system in accordance with a fifth embodiment of the present invention.
Figure 16:
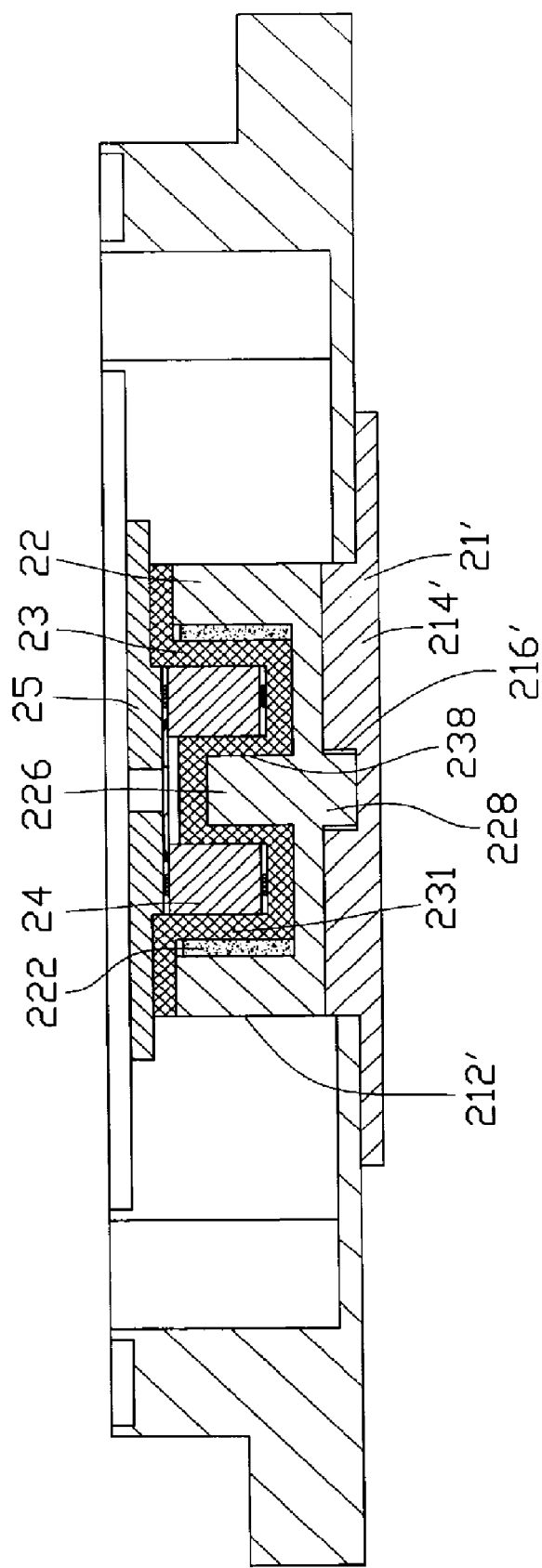
FIG. 16 is an assembled, cross-sectional view of the pump and the base of FIG. 15.

FIGS. 15-16 show a pump 20' and a base 10' in accordance with a fifth embodiment of the present invention. In the fifth embodiment, a pump 20' replaces the pump 20 of the aforementioned embodiments and the base 10' is the same as the base 10' of the fourth embodiment. Most parts of the pump 20' of the fifth embodiment are the same as the aforementioned embodiments. A main difference is that in the fifth embodiment the pump 20' comprises a casing 21' having a plate-shaped configuration, while in the aforementioned embodiments the casing 21 has a cylindrical chamber. The casing 21' comprises a disk-like plate 214' having a top surface and a bottom surface. The bottom surface contacts with the heat-generating electronic component and absorbs the heat generated by the electronic component. A protrusion portion 215' extends upwardly from the top surface of the plate 214', for extending into the base 10' and hermetically engaging in a bottom of the opening 100 of the base 10'. The protrusion portion 215' defines a blind hole 216' in a central portion thereof, for receiving the lower axle 228 of the rotor 22 therein. After the casing 21' is mounted to a bottom of the base 10' with the protrusion 215' fitted in a lower part of the opening 100, a chamber 212' of the pump 20' is defined by a part of the opening 100 above the casing 21'. Thereafter, the magnetic rotor 22, the partition seat 23, the stator 24 are sequentially mounted in the chamber 212'. Finally, the top cover 25 is secured to the base 10' and covers a top of the opening 100.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system for a heat-generating electronic component comprising:
   a base defining therein a center opening and slots, and channels communicating the opening with the slots;
   a heat-dissipating member mounted to the base, and defining therein a plurality of fluid flow channels for passage of a coolant;
   a pump having a chamber receiving the coolant therein, and being mounted in the opening and being in fluid communication with the slots of the base and the channels of the heat-dissipating member via the slots, the pump comprising a bottom plate having a top surface and a bottom surface, and a rotor received in the chamber and engaging with the bottom plate, the rotor having a cylindrical wall and a substrate connecting with a bottom end of the wall, wherein the top surface of the bottom plate of the pump contacts with the coolant in the chamber, the bottom surface of the bottom plate contacts with the heat-generating electronic component for absorbing heat generated by the electronic component.

2. The liquid cooling system of claim 1, wherein an upper axle extends upwardly from a center of the substrate of the rotor and a lower axle extends downwardly from the center of the substrate of the rotor, and the lower axle is engaging in a center hole defined in the bottom plate of the pump.

3. The liquid cooling system of claim 2, wherein the substrate of the rotor contacts with the bottom plate of the pump.

4. The liquid cooling system of claim 2, wherein a gap is defined between the substrate of the rotor and the bottom plate of the pump.

5. The liquid cooling system of claim 1 wherein the wall of the rotor having an inner surface and an outer surface, and a magnetic ring abutting against the inner surface of the wall, and a plurality of plate-shaped vanes extending from the outer surface of the wall.

6. The liquid cooling system of claim 1, wherein an agitator is received in the chamber of the casing and formed on the substrate of the rotor, for agitating the coolant in the chamber of the pump.

7. The liquid cooling system of claim 6, wherein the agitator comprises a plurality of agitating plates formed on the substrate.

8. The liquid cooling system of claim 7, wherein each of the agitating plates is linear.

9. The liquid cooling system of claim 7, wherein each of the agitating plates is curvilinear.

10. The liquid cooling system of claim 1, wherein the pump comprises a casing having the chamber and the bottom plate, the rotor, a partition seat, a stator and a top cover hermetically attached to a top end of the casing, wherein the rotor, the partition seat and the stator in series are received in the chamber of the casing, the partition seat is mounted between the rotor and the stator for isolating the coolant from the stator to prevent the coolant from entering the stator.

11. The liquid cooling system of claim 10, wherein the casing defines an inlet and an outlet both being in flow communication with the chamber of the casing so that the coolant is capable of entering into casing via the inlet and escaping the casing via the outlet.

12. The liquid cooling system of claim 11, wherein the slots comprise a pair of slots defined at two opposite sides of the opening, the channels of the base respectively corresponding to the inlet and the outlet and interconnecting the opening and the two slots.

13. The liquid cooling system of claim 12, wherein the heat-dissipating member comprises a plurality of fins, a plurality of heat-dissipating conduits, and a pair of opposite fluid tanks connected to ends of the heat-dissipating conduits, wherein the heat-dissipating conduits and the fluid tanks form the plurality of fluid flow channels.

14. The liquid cooling system of claim 13, wherein joint flanges are formed at tops of the slots, for hermetically engaging in the fluid tanks of the heat-dissipating member.

15. The liquid cooling system of claim 10, wherein the partition seat comprises a cylindrical body having an inner space and a bottom portion, an annular plate extending outwardly from a top of the cylindrical body, a shaft extending upwardly from a center of the bottom portion of the cylindrical body, and a mating hole is defined in a bottom of the center of the bottom portion for receiving an upper axle extending from the substrate of the rotor therein.

* * * * *